United States Patent
Park et al.

(10) Patent No.: US 6,355,520 B1
(45) Date of Patent: Mar. 12, 2002

(54) METHOD FOR FABRICATING $4F^2$ MEMORY CELLS WITH IMPROVED GATE CONDUCTOR STRUCTURE

(75) Inventors: Youngjin Park, Poughkeepsie; Heon Lee, Fishkill, both of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/374,537

(22) Filed: Aug. 16, 1999

(51) Int. Cl.$^7$ ............... H01L 21/336; H01L 21/8242
(52) U.S. Cl. .............. 438/253; 438/239; 438/270; 438/396; 438/430; 438/589
(58) Field of Search ................. 257/302, 303, 257/306, 311; 438/206, 209, 212, 242–249, 253, 270–272, 386–392, 396, 430, 589, 239

(56) References Cited

U.S. PATENT DOCUMENTS

| | | | | |
|---|---|---|---|---|
| 5,307,310 A | * | 4/1994 | Narita | 365/149 |
| 5,362,665 A | * | 11/1994 | Lu | 438/253 |
| 5,497,017 A | * | 3/1996 | Gonzales | 257/306 |
| 5,674,769 A | * | 10/1997 | Alsmeier et al. | 438/239 |
| 5,710,056 A | * | 1/1998 | Hsu | 438/242 |
| 5,817,552 A | * | 10/1998 | Roesner et al. | 438/241 |
| 5,828,094 A | * | 10/1998 | Lee | 257/296 |
| 5,929,476 A | * | 7/1999 | Prall | 257/296 |
| 5,959,322 A | * | 9/1999 | Lee | 257/298 |
| 6,097,049 A | * | 8/2000 | Goebel et al. | 257/296 |
| 6,153,475 A | * | 11/2000 | Hofmann et al. | 438/270 |
| 6,159,789 A | * | 12/2000 | Chuang et al. | 438/253 |
| 6,184,091 B1 | * | 2/2001 | Gruening et al. | 438/270 |

* cited by examiner

*Primary Examiner*—Mary Wilczewski
*Assistant Examiner*—Toniae M. Thomas

(57) ABSTRACT

In accordance with the present invention, a method for forming gate conductors in $4F^2$ area stacked capacitor memory cells includes the steps of forming a buried bit line in a substrate, forming an active area above and in contact with the buried bit line and separating portions of the active area by forming a dielectric material in trenches around the portions of the active area. Portions of the dielectric material are removed adjacent to and selective to the portions of the active area. A first portion of a gate conductor is formed in locations from which the portion of dielectric material is removed, and a second portion of the gate conductor is formed on a top surface of the dielectric material and in contact with the first portion of the gate conductor. Stacked capacitors are formed such that the gate conductor activates an access transistor formed in the portions of the active area. A layout is also included.

19 Claims, 5 Drawing Sheets

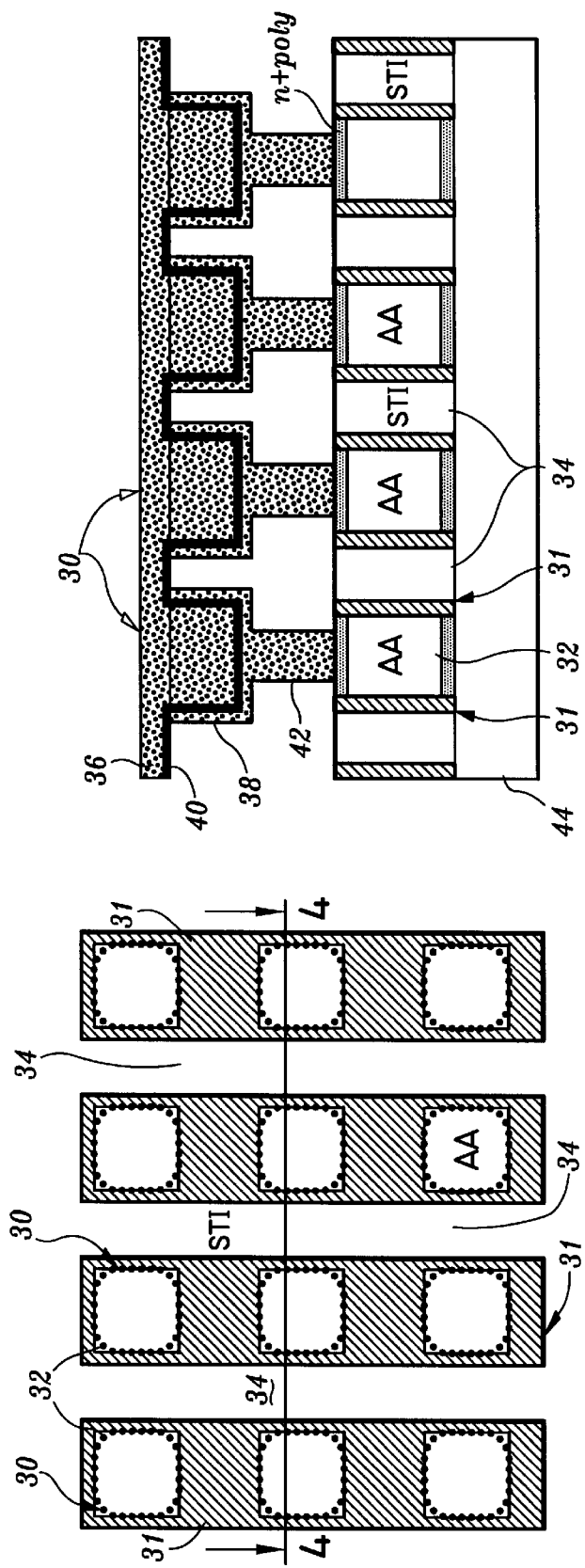

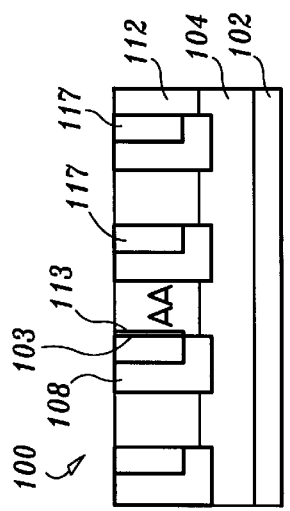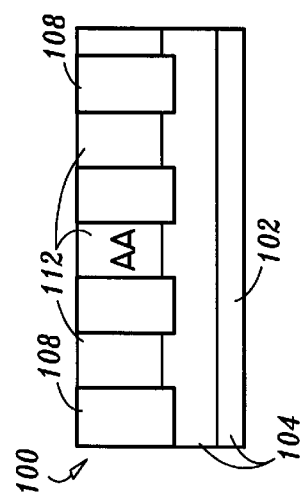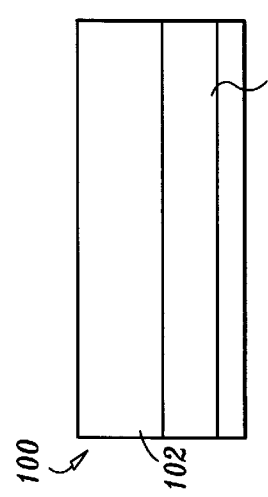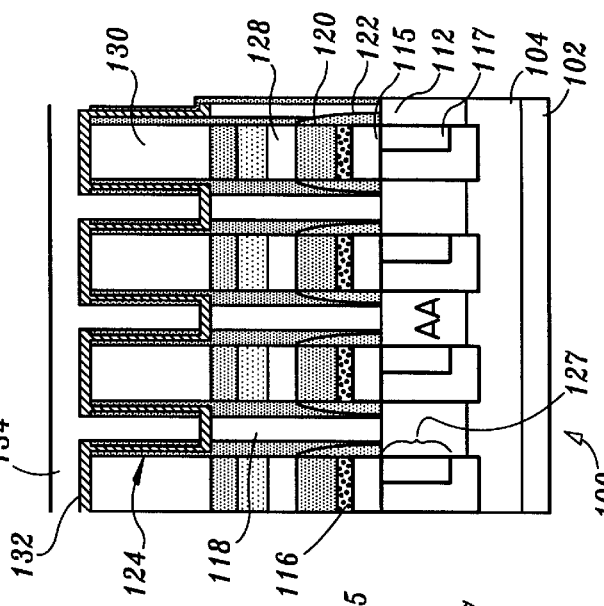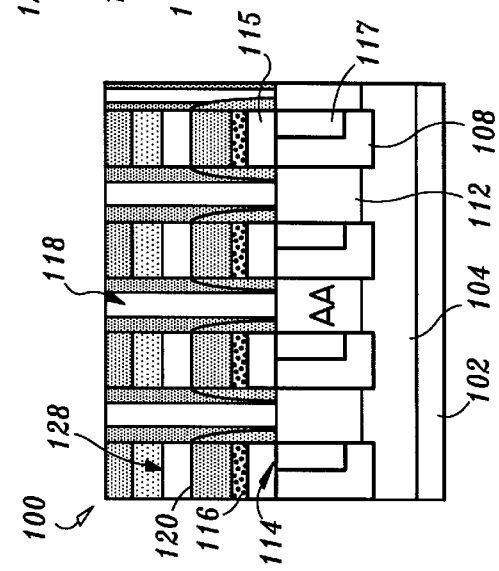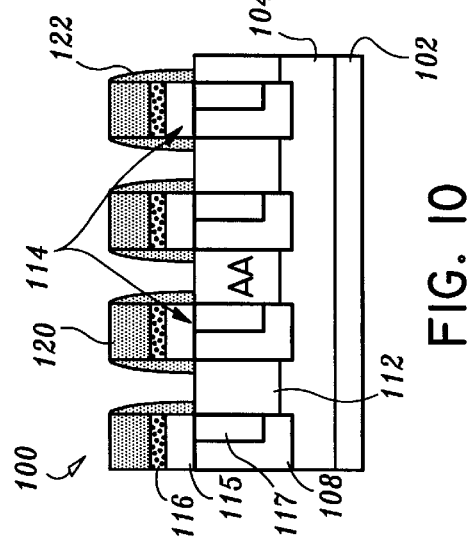

METHOD FOR FABRICATING 4F² MEMORY CELLS WITH IMPROVED GATE CONDUCTOR STRUCTURE

BACKGROUND

1. Technical Field

This disclosure relates to semiconductor memory fabrication and more particularly, a method for fabricating improved gate conductors.

2. Description of the Related Art

Semiconductor memory cells include capacitors accessed by transistors to store data. Data is stored by as a high or low bit depending on the state of the capacitor. The capacitor's charge or lack of charge indicates a high or low when accessed to read data, and the capacitor is charged or discharged to write data from the capacitor.

Stacked capacitors are among the types of capacitors used in semiconductor memories. Stacked capacitors are typically located on top of the transistor used to access a storage node of the capacitor as opposed to trench capacitors which are buried in the substrate of the device. As with many semiconductor devices, higher density in a smaller layout area is preferable. Memory cells for semiconductor devices may occupy an area of $4F^2$ (where F is a minimum feature size of a technology) to provide reduced area and higher memory cell packing density.

For conventional $4F^2$ stacked capacitor DRAMs, spacer type gate structures or wrap-around type gate structures (surrounded gate) are typically used to fit $4F^2$ design rules. (See, e.g., M. Terauchi et al. "A surrounding gate transistor (SGT) gain cell for ultra high density DRAMS," Symp. on VLSI Technology, pp. 21–22, 1993. These gate structures suffer from many disadvantages despite their area efficient structure. One disadvantage includes high resistance of the gate conductor due to the gate conductor's narrow geometry. This impacts the overall cell performance. Referring to FIG. 1, a layout for $4F^2$ memory cells each having stacked capacitors with a space gate design is shown. In the layout, stacked capacitors 10 are disposed in rows and columns. Active areas 12 are disposed below stacked capacitors 10. Active areas 12 are surrounded by shallow trench isolation regions 14. A spacer gate 17 extends along active areas 12. Spacer gates 17 are in pairs and have a dielectric material 13 (STI oxide) formed between them.

Referring to FIG. 2, a cross-section of the layout of FIG. 1 is taken at section line 2—2. Stacked capacitors 10 are shown having a top electrode 16, a bottom electrode 18 and a capacitor dielectric layer 20 therebetween. Bottom electrode 18 is connected to a plug or capacitor contact 22 which extends down to a portion of active area 12. Active areas 12 form an access transistor for charging and discharging stacked capacitor 10 in accordance with data on a buried bitline 24. Bitline 24 is coupled to a portion of active area 12 (source or drain of the access transistor). When a gate conductor or spacer gate 17 is activated the access transistor conducts and charges or discharges stacked capacitor 10. As illustrated, spacer gates 17 suffer from high resistance which is compounded if spacer gates are formed too thin or contain anomalies such as voids, etc.

Referring to FIG. 3, a layout is shown for $4F^2$ memory cells having stacked capacitors and wrap around gates. In the layout, stacked capacitors 30 are disposed in rows and columns. Active areas 32 are disposed below stacked capacitors 30, similar to FIG. 1. Active areas 32 are surrounded by wrap around gates 31. Shallow trench isolation regions (STI) 34 occupy regions adjacent to wrap around gates 31.

Referring to FIG. 4, a cross-sectional view is shown taken at section line 4—4 of FIG. 3. Stacked capacitors 30 are shown having a top electrode 36, a bottom electrode 38 and a capacitor dielectric layer 40 therebetween. Bottom electrode 38 is connected to a plug 42 which extends down to a portion of active area 32. Active areas (AA) 32 form an access transistor for charging and discharging stacked capacitor 30 in accordance with data on a buried bitline 44. Bitline 44 is coupled to a portion of active area 32 (source or drain of the access transistor). When wrap around gate 31 is activated the access transistor conducts and charges or discharges stacked capacitor 30. As illustrated, wrap around gates 31 also suffer from high resistance which is compounded if wrap around gates are formed too thin or contain anomalies such as voids, etc.

In both cases described above, the geometry of gate conductors is highly limited by design rules. Since the cross-sectional area of gate conductor is quite narrow, the resistance of gate conductors is fairly high and can adversely affect the overall cell performance. The use of highly conducting materials such as silicides or metals are also limited by the small geometry of the gate conductor.

Therefore, a need exists for an improved layout for stacked capacitor memory cells with $4F^2$ area which provides lower gate resistance and improved cell performance. A further need exists for a method for fabricating gates for the stacked capacitor memory cells.

SUMMARY OF THE INVENTION

In accordance with the present invention, a method for forming gate conductors in $4F^2$ area stacked capacitor memory cells includes the steps of forming a buried bit line in a substrate, forming an active area above and in contact with the buried bit line and separating portions of the active area by forming a dielectric material in trenches around the portions of the active area. Portions of the dielectric material are removed adjacent to and selective to the portions of the active area. A first portion of a gate conductor is formed in locations from which the portion of dielectric material is removed, and a second portion of the gate conductor is formed on a top surface of the dielectric material and in contact with the first portion of the gate conductor. Stacked capacitors are formed such that the gate conductor activates an access transistor formed in the portions of the active area.

Another method, in accordance with the present invention, for forming gate conductors in $4F^2$ area stacked capacitor memory cells includes the steps of forming a buried bit line in a substrate, forming an active area above and in contact with the buried bit line and separating portions of the active area by forming a dielectric material in trenches around the portions of the active area. Then by removing portions of the dielectric material adjacent to and selective to the portions of the active area, a gate oxide is formed on portions of the active area exposed by the removal of portions of the dielectric material. The method also includes the steps of forming a first portion of a gate conductor in locations from which the portion of dielectric material is removed. The first portion of the gate conductor is in contact with a single portion of the portions of the active area. A second portion of the gate conductor is formed on a top surface of the dielectric material and in contact with the first portion of the gate conductor wherein the second portion of the gate conductor includes a height which is adjusted to provide a desired gate resistance. A pad stack is created by forming a conductive material on the second portion of the gate conductor and forming stack capacitors such that the gate conductor activates an access transistor formed in the single portion of the active area.

In alternate methods, the first portion of the gate conductor preferably extends adjacent to the active area a vertical distance of greater than or equal to about 1F where F is a minimum feature size for a given technology. The vertical distance preferably represents a transistor channel length for the access transistor. The step of spacing adjacent gate conductors a horizontal distance of at least 1F apart where F is a minimum feature size for a given technology may be included. The method may further include the step of adjusting a height of the second portion to adjust gate conductor resistance.

The method may further include the step of forming one of a metal and a polycide on the second portion of the gate conductor to form a gate stack. The method may include the step of forming a nitride or oxide cap and spacers on the gate stack. The first and the second portions of the gate conductor may be formed in a single deposition process. The step of forming stacked capacitors may include the steps of forming a gate stack including the gate conductor, patterning a first dielectric layer over the gate stack, depositing a conductive layer in the patterned dielectric layer to form a stacked capacitor contact, patterning a second dielectric layer on the first dielectric layer, forming a bottom electrode in the second dielectric layer, depositing a capacitor dielectric layer on the conductive layer and forming a top electrode. The active area, the capacitor contact and the bottom electrode may be substantially aligned to occupy a same layout area. The same layout area for the active area, the capacitor contact and the bottom electrode is preferably about $1F^2$.

A layout for a semiconductor memory having memory cells with a layout area of $4F^2$, according to the present invention, includes a substrate having a buried bit line formed therein. The substrate includes active area portions. The active area portions are surrounded by a dielectric material other than on a first vertically disposed surface. A gate conductor has a first portion adjacent to an active area portion at the first vertically disposed surface. The vertically disposed surface extends a vertical distance of greater than one minimum feature size, and a second portion of the gate conductor is formed on a top surface of the dielectric material above the first dielectric material. The first portion and the second portion of the gate conductor are in contact such that upon activating the gate conductor an access transistor formed in the active area portions conducts between the buried bit line and a stacked capacitor. The access transistor has a channel length equal in length to the vertically disposed surface.

In alternate embodiments, the active area, a capacitor contact which is connected to the active area and a bottom electrode of the stacked capacitor which is connected to the capacitor contact are preferably all substantially aligned to occupy a same layout area. Adjacent gate conductors are preferably separated by at least one minimum feature size. The layout may further include a conductive layer formed on the second portion of the gate conductor to form a pad stack. The conductive layer may include one of a metal and a polycide.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 3 is another conventional layout for $4F^2$ memory cells having wrap around or surround gate conductors;

FIG. 4 is a cross-sectional view taken at section line 4—4 of FIG. 3 showing wrap around gate conductors in accordance with the prior art;

FIG. 7 is a cross-sectional view of a semiconductor memory having a buried bitline formed therein for processing in accordance with the present invention;

FIG. 8 is a cross-sectional view of the semiconductor memory of FIG. 7 having active areas formed, STI formed and a top surface planarized for processing in accordance with the present invention;

FIG. 9 is a cross-sectional view of the semiconductor memory of FIG. 8 having a lower portion of a gate conductor formed and planarized in accordance with the present invention;

FIG. 10 is a cross-sectional view of the semiconductor memory of FIG. 9 having an upper portion of the gate conductor formed which is included in a gate stack in accordance with the present invention;

FIG. 11 is a cross-sectional view of the semiconductor memory of FIG. 10 showing a dielectric layer with capacitor contacts formed therein in accordance with the present invention; and FIG. 12 is a cross-sectional view of the semiconductor memory of FIG. 11 showing a dielectric layer with bottom electrodes, a capacitor dielectric and a top electrode formed in accordance with the present invention.

DETAILED DESCRIPTION OF PREFERRED EMBODIMENTS

The present invention relates to semiconductor memory fabrication and more particularly, a method for fabricating improved gate conductors. The present invention provides an improved $4F^2$ memory cell layout in which lower resistance is achieved through the gate structure. In one embodiment, a $4F^2$ stacked capacitor dynamic random access memory (DRAM) structure and process flow are described to improve the gate conductor structure. By employing the present invention, larger gate structures may be implemented in the $4F^2$ area having channel lengths of 1F or greater.

Figures 1, 2:
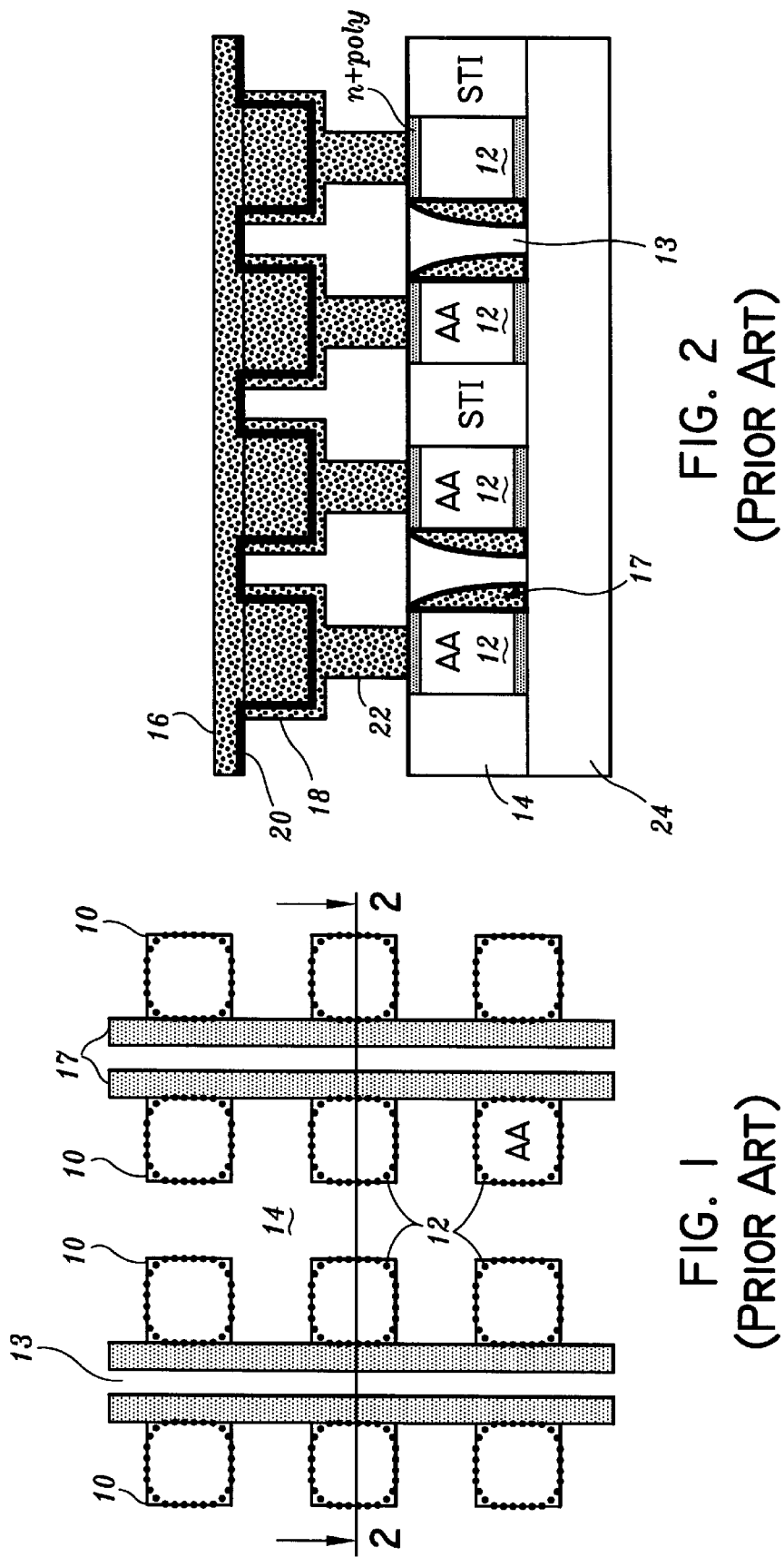
FIG. 1 is a conventional layout for $4F^2$ memory cells having a spacer gate conductor.
FIG. 2 is a cross-sectional view taken at section line 2—2 of FIG. 1 showing spacer gate conductors in accordance with the prior art.
Figure 5:
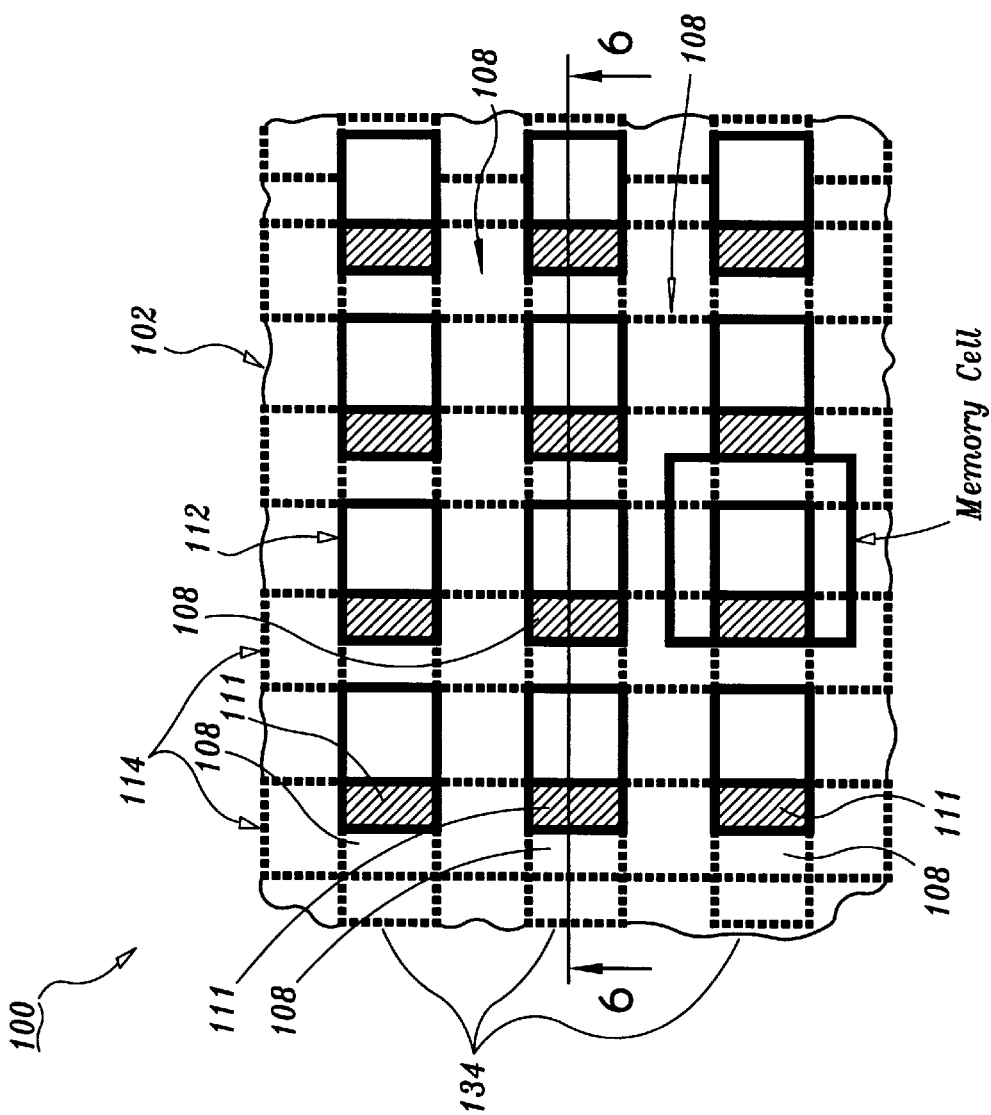
FIG. 5 is a layout for $4F^2$ memory cells in accordance with the present invention.
Figure 6:
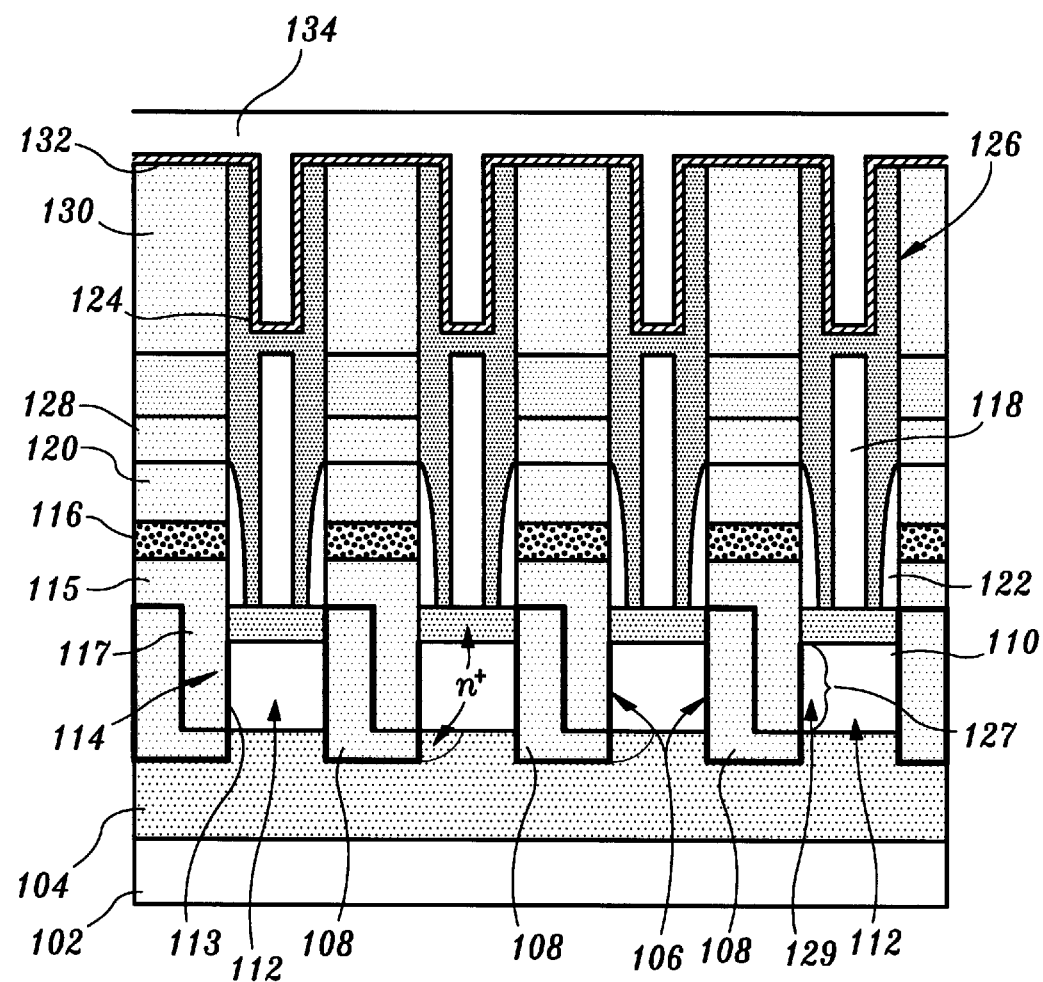
FIG. 6 is a cross-sectional view taken at section line 6—6 of FIG. 5 showing gate conductors having an upper portion on a surface of a shallow trench isolation and a lower portion for activating an access transistor formed in an active area in accordance with the present invention.

Referring now in specific detail to the drawings in which like reference numerals identify similar or identical elements throughout the several views, and initially to FIGS. 5 and 6, a layout (FIG. 5) and a cross-section (FIG. 6) taken at section line 6—6 of FIG. 5 for $4F^2$ memory cells on a memory device 100 in accordance with the present invention are shown. Memory device 100 may include DRAM, synchronous DRAM, embedded DRAM or other memory devices. A substrate 102 is provided, preferably formed from a semiconductor material such as silicon or other substrate materials known in the art. A buried bit line 104 is formed in substrate 102. Substrate 102 is patterned to form trenches 106 into which shallow trench isolation dielectric 108 is deposited. Portions 110 of substrate 102 are doped and prepared for use as active areas 112. A portion of dielectric 108 is removed to form a gate oxide 113 and gate conductor material 114 is deposit. The depth of a lower portion 117 of gate conductor 114 is larger than 1F. This depth of gate conductor 114 determines cell transistor channel length. Upper portion 115 of gate conductor 114 is formed on STI 108 and connected with lower portion 117 of gate conductor 114. Lower portion 117 preferably provides a channel length of 1F or greater. About a 1F distance exits between adjacent gate conductors. Upper portion 115 may be increased in thickness vertically to provide reduced line resistance. This is significantly larger than the wrap around gate and the spacer gate of the prior art. In this way, gate conductivity is significantly improved. A metal silicide 116 or highly conductive material may be formed on gate conductor 114 to further improve conductivity of gate conductor 114. Gate conductor 114 is isolated by a gate cap 120 and spacers 122. Gate cap 120 and spacers 122 are preferably formed from a nitride (or oxide) material.

Active areas 112 may include more than one type of doping for example portions of active area 112 in contact with bitline 104 and in contact with a plug or capacitor contact 118 may include n$^+$ dopants while other portions include p$^-$ dopants. Active areas 112 form an access transistor 129 by forming a channel 127 to provide access to stacked capacitors 126 for reading and writing data to and from stacked capacitor 126 from bitline 104. Plug 118 connects to a bottom electrode 124 of stacked capacitor 126. Plug 118 passes through a dielectric layer 128 which preferably includes a glass material, for example borophosphorous silicate (BPSG) or the like. Another dielectric layer 130 is formed on dielectric layer 128. Dielectric layer 130 may include an oxide material. Bottom electrode 124 is formed in dielectric layer 130. A capacitor dielectric 132 is formed on bottom electrode followed by a top electrode 134.

In this structure, gate conductor 114 includes benefits achieved by the combination of a "damascene gate" to provide switching for each memory cell and a stacked gate to lower the gate conductor resistance. Gate conductor 114 includes an upper portion 115 and a lower portion 117. Upper portion 115 and lower portion 117 may be formed in a single process step (e.g., a dual damascene process). Alternately, upper portion 115 and lower portion 117 may be formed in separate processes as described below. Gate conductor 114 is preferably deposited in etched away regions indicated in FIG. 5 as regions 111. Unlike conventional 4F$^2$ cells, the roles of gate conductor 114 are split into two different gate conductor functions for example, high conductivity due to the stacked gate structure and its dimensions and a vertical transistor structure for saving space in each memory cell.

Since, conventional polycide type gate conductors with desired gate stack height may be used, the resistance of the gate conductors can be lowered, while maintaining the 4F$^2$ cell layout design rule. Metal and/or polysilicon gate stacks may also be used in this structure to maximize the overall cell performance.

Referring to FIG. 7, substrate 102 is provided, preferably formed from a semiconductor material such as silicon or other substrate materials known in the art. A buried bit line 104 is formed in substrate 102 by an ion implantation process known to those skilled in the art.

Referring to FIG. 8, dopants are implanted into active areas 112 by using methods known to those skilled in the art.

Active areas 112 may include more than one type of doping for example portions of active area 112 in contact with bitline 104 and/or in contact with a plug or capacitor contact 118 (FIG. 6 or 11) may include n$^+$ dopants while other portions include p$^-$ dopants. Substrate 102 is patterned to form trenches 106 in active areas 112. Shallow trench isolation dielectric 108 is deposited into trenches 106. A top surface of device 100 is planarized by, for example, a chemical-mechanical polishing (CMP) step.

Referring to FIG. 9, a portion of dielectric 108 is removed selective to substrate 102. This portion will be the location of the gate conductor in accordance with the present invention. A gate oxide 113 is formed by oxidizing substrate 102 on a lateral side 103 of active area 112. A portion 117 of gate conductor is deposited. Material for a gate conductor 114 preferably includes polysilicon or doped polysilicon. Gate conductor material 117 is planarized, by for example, CMP.

Referring to FIG. 10, a metal silicide 116 or highly conductive material (polycide or metal/poly Si) is formed on a portion 115 of gate conductor to further improve gate conductivity. Gate conductor 114 is isolated by a gate cap layer 120 which is preferably etched to conform with the dimensions of gate conductor 114. A spacer layer is deposited and etched to form spacers 120. Gate cap 120 and spacers 122 are preferably formed from a nitride material, such as SiN$_x$ or an oxide, such as SiO$_2$. Upper portion 115 of gate conductor is advantageously about one minimum feature size (1F) in line width having a 1F distance between gate conductors when viewed from the top (see FIG. 5). This is significantly larger than the wrap around gate and the spacer gate of the prior art. In this way, gate conductivity is significantly improved (i.e., gate resistance is decreased). Further, upper portion 115 has the freedom to be increased in its vertical dimension to increase the cross-sectional area of gate conductor 114. Lower portion 117 increases the cross-sectional area of gate conductor 114 even further while providing a channel length 127 (FIG. 12) in active area (AA) 112 of greater than or equal to 1F.

Referring to FIG. 11, dielectric layer 128 is deposited which preferably includes a glass material such as borosilicate glass (BSG), HDP oxide (high density plasma oxide) or equivalents. Dielectric layer 128 is patterned to form holes to form plugs 118. Plugs 118 are formed by depositing a conductive material, such as a metal or polysilicon into the holes for plug 118. The surface is planarized by, for example, CMP.

Referring to FIG. 12, another dielectric layer 130 is formed on dielectric layer 128 and plugs 118. Dielectric layer 130 may include an oxide material which is etched to form trenches for bottom electrodes 124. Bottom electrodes 124 are formed by depositing a conductive material in the trenches formed in dielectric layer 130. A capacitor dielectric 132 is formed on bottom electrode followed by a planarization process which isolates bottom electrodes 124 by breaking the continuity between them. A top electrode 134 is then formed by a deposition process.

The steps of this invention may form a "damascene gate", i.e., concurrently forming the portion of the gate conductor in the shallow trench isolation (STI) and on the surface of the STI, as described above. The STI oxide is etched selectively to active area silicon and the etched out portion of STI is filled with the gate conductor material to form a vertical transistor. After the gate conductor fill, a polycide type or metal/poly Si type gate conductor stack is deposited. As a result, the gate structure is inserted into the STI oxide to satisfy 4F$^2$ cell layout design rules and provide higher conductance of the gate conductor.

What is claimed is:

1. A method for forming gate conductors in $4F^2$ area stacked capacitor memory cells comprising the steps of:
  forming a buried bit line in a substrate;
  forming an active area above and in contact with the buried bit line and separating portions of the active area by forming a dielectric material in trenches around the portions of the active area;
  removing portions of the dielectric material adjacent to and selective to the portions of the active area;
  forming a first portion of a gate conductor in locations from which the portion of dielectric material is removed;
  forming a second portion of the gate conductor on a top surface of the dielectric material and in contact with the first portion of the gate conductor; and
  forming stacked capacitors such that the gate conductor activates an access transistor formed in the portions of the active area.

2. The method as recited in claim 1, wherein the first portion of the gate conductor extends adjacent to the active area a vertical distance of greater than or equal to about 1F where F is a minimum feature size for a given technology, the vertical distance representing a transistor channel length for the access transistor.

3. The method as recited in claim 1, further comprising the step of forming one of a metal and a polycide on the second portion of the gate conductor to form a gate stack.

4. The method as recited in claim 3, further comprising the step of forming a cap and spacers on the gate stack for electrical isolation.

5. The method as recited in claim 1, the first and the second portions of the gate conductor are formed in a single deposition process.

6. The method as recited in claim 1, wherein the step of forming stacked capacitors further comprises the steps of:
  forming a gate stack including the gate conductor;
  patterning a first dielectric layer over the gate stack;
  depositing a conductive layer in the patterned dielectric layer to form a stacked capacitor contact;
  patterning a second dielectric layer on the first dielectric layer;
  forming a bottom electrode in the second dielectric layer;
  depositing a capacitor dielectric layer on the conductive layer; and
  forming a top electrode.

7. The method as recited in claim 6, wherein the portion of the active area, the capacitor contact and the bottom electrode are substantially aligned to occupy a same layout area.

8. The method as recited in claim 7, wherein the same layout area is about $1F^2$.

9. The method as recited in claim 1, further comprising the step of adjusting a height of the second portion to adjust gate conductor resistance.

10. The method as recited in claim 1, further comprising the step of spacing adjacent gate conductors a horizontal distance of at least 1F apart where F is a minimum feature size for a given technology.

11. A method for forming gate conductors in $4F^2$ area stacked capacitor memory cells comprising the steps of:
  forming a buried bit line in a substrate;
  forming an active area above and in contact with the buried bit line and separating portions of the active area by forming a dielectric material in trenches around the portions of the active area;
  removing portions of the dielectric material adjacent to and selective to the portions of the active area;
  forming a gate oxide on portions of the active area exposed by the removal of portions of the dielectric material;
  forming a first portion of a gate conductor in locations from which the portion of dielectric material is removed, the first portion of the gate conductor being in contact with a single portion of the portions of the active area;
  forming a second portion of the gate conductor on a top surface of the dielectric material and in contact with the first portion of the gate conductor wherein the second portion of the gate conductor includes a height which is adjusted to provide a desired gate resistance;
  forming a pad stack by forming a conductive material on the second portion of the gate conductor; and
  forming stacked capacitors such that the gate conductor activates an access transistor formed in the single portion of the active area.

12. The method as recited in claim 11, wherein the conductive material includes one of a metal and a polycide.

13. The method as recited in claim 12, further comprising the step of forming a cap and spacers on the gate stack for electrical isolation.

14. The method as recited in claim 11, the first and the second portions of the gate conductor are formed in a single deposition process.

15. The method as recited in claim 11, wherein the step of forming stacked capacitors further comprises the steps of:
  patterning a first dielectric layer over the gate stack;
  depositing a conductive layer in the patterned dielectric layer to form a stacked capacitor contact;
  patterning a second dielectric layer on the first dielectric layer;
  forming a bottom electrode in the second dielectric layer;
  depositing a capacitor dielectric layer on the conductive layer; and
  forming a top electrode.

16. The method as recited in claim 15, wherein the portion of the active area, the capacitor contact and the bottom electrode are substantially aligned to occupy a same layout area.

17. The method as recited in claim 16, wherein the same layout area is about $1F^2$.

18. The method as recited in claim 11, wherein the first portion of the gate conductor extends adjacent to the active area a vertical distance of greater than or equal to about 1F where F is a minimum feature size for a given technology, the vertical distance representing a transistor channel length for an access transistor.

19. The method as recited in claim 11, further comprising the step of spacing adjacent gate conductors a horizontal distance of at least 1F apart where F is a minimum feature size for a given technology.

* * * * *